United States Patent Office 3,547,651

Patented Dec. 15, 1970

3,547,651

PHOTOPOLYMERIZABLE COMPOSITIONS CONTAINING ORGANOMETAL COMPOUNDS

Leo Roos, New Shrewsbury, N.J., assignor to E. I. du Pont de Nemours and Company, Wilmington, Del., a corporation of Delaware No Drawing. Filed Apr. 2, 1968, Ser. No. 718,248
Int. Cl. G03c *1/68*
U.S. Cl. 96—115 14 Claims

ABSTRACT OF THE DISCLOSURE

Photopolymerizable compositions having increased speed and improved storage stability comprising a thermoplastic macromolecular organic binder, an ethylenically unsaturated compound containing 1 to 4 terminal ethylenic groups and capable of forming a high polymer by photo-initiated addition polymerization, and a free-radical addition polymerization initiator activatable by actinic light; characterized by the presence, as a sensitometric modifier, of a covalent organometal compound of tin, lead, germanium, or titanium, having at least one carbon-metal bond.

BACKGROUND OF THE INVENTION

Field of the invention

This invention is directed to new photopolymerizable compositions and to improved addition polymerizable elements prepared from said photopolymerizable compositions. More particularly this invention is directed to such compositions and elements which have increased speed and enhanced thermal stability. Still more particularly this invention is directed to photopolymerizable compositions and elements which are useful in the dry transfer methods of reproduction as disclosed in Burg & Cohen U.S. Patents 3,060,023; 3,060,024; 3,060,025; Heiart U.S. 3,060,026; Colgrove U.S. 3,353,959 and Jeffers U.S. Ser. No. 407,245 filed Oct. 28, 1964, now Patent No. 3,408,191.

Description of the prior art

Photopolymerizable compositions and elements are those described in Plambeck, U.S. Patents 2,760,863 and 2,791,504. Martin & Barney U.S. Patent 2,927,022, the Burg & Cohen patents, the Heiart patents, the Colgrove patent and the Jeffers application referred to above. The photopolymerizable elements have on a suitable support a photopolymerizable layer comprising a polymeric binder, an addition polymerizable ethylenically unsaturated compound capable of forming a high polymer by photoinitiated addition polymerization, and an addition polymerization initiator activatable by actinic light. Certain of these photopolymerizable compositions, particularly those which contain esters of acrylic acid, while extremely useful in the preparation of relief printing elements, lithographic printing elements, and images from dry transfer processes as described in the above patents, upon storage, become less sensitive to actinic light due to the diffusion of oxygen from the air into the photopolymerizable layer. After exposing and processing, as in the case of relief elements, or peeling apart as in the case of dry transfer processes the image areas of such oxygen desensitized elements are of poor quality because of low speed and poor storage stability. There are means of removing or preventing oxygen from saturating or desensitizing the photopolymerizable layer. One example is storing or treating the element in an essentially oxygen-free atmosphere of inert gas. This technique gives satisfactory results but requires special equipment and is time consuming. It is also known to add a stannous salt of an acid soluble in the polymerizable ethylenically unsaturated monomer and compatible, but non-reactive with the addition polymerizable initiator. While stannous salts, e.g., stannous chloride, substantially reduce the influence of oxygen and improve the storage stability and photographic speed of the photopolymerizable element, it has the great disadvantage of being ionizable and unstable and it loses its effectiveness with aging.

SUMMARY OF THE INVENTION

This invention pertains to new photopolymerizable compositions and layers which comprise:

(1) 40 to 90 parts by weight of a compatible, coherent film-forming marcromolecular organic polymer having a molecular weight greater than 10,000;

(2) 10 to 60 parts by weight of a normally non-gaseous, ethylenically unsaturated compound containing 1 to 4 terminal ethylenic groups having a molecular weight of at least 200, a boiling point above 100° C. at normal atmospheric pressure and being capable of forming a high polymer by photoinitiated addition polymerization;

(3) 0.001 to 20 parts by weight of an addition polymerization initiator activatable by actinic light and inactive thermally below 85° C. and preferably below 185° C.; and (4) .01 to 10 parts by weight of at least one covalent organometal compound of tin, lead, germanium, or titanium having at least one carbon to metal bond.

The photopolymerizable compositions of this invention may be coated to form a solid layer on a suitable support which may be a flexible film, stiff sheet or plate, planar or curved and which may have an intermediate anchor or sublayer. The coated element may also have an antihalation layer in light-absorbing relationship with the light-sensitive layer. The element, when used in transfer processes such as those described in Colgrove, U.S. Patent 3,353,955 contains a second support laminated to the surface of the coated layer, both supports having different adhesions for exposed and unexposed areas of the photopolymerizable layer.

The photopolymerizable composition may be coated by conventional coating apparatus or by extruding apparatus. Suitable processes and apparatus are described in the patents listed above and in Munger, U.S. Patent 2,923,-673. The photopolymerizable layer may or may not contain a coloring matter, e.g., a dye or pigment.

The photopolymerizable element can be exposed through a process transparency, line drawing or other suitable light stencil and the unexposed areas removed in a suitable solvent solution or, as in the dry transfer processes of the Colgrove patent, the exposed and unexposed areas may be separated by peeling the supports apart. Good quality images are obtained in both processes.

DESCRIPTION OF THE PREFERRED EMBODIMENTS

The invention will now be illustrated in and by the following examples.

Example I.—A photopolymerizable composition was made containing the following ingredients:

| | Grams |
|---|---|
| Copolymer of methyl methacrylate/methacrylic acid (in a mol percent of 90/10) | 40.0 |
| Triacrylate of the reaction product of trimethylol propane with 20 moles of ethylene oxide | 45.0 |
| Polyethylene oxide (4) lauryl ether [1] | 10.0 |
| Carbon black (particle size 13 millimicrons) (15% dispersion in isopropanol) | 10.0 |
| 5,5-dimethyl-1,3-cyclohexadione | 2.0 |
| Tributyl tin acetate | 2.0 |
| New Methylene Blue (C.I. 52030) | 1.5 |
| Trichloroethylene to make | 650.0 |

[1] Contains 4 oxyethyl radicals.

The mixture was thoroughly mixed by ball-milling for 12 hours. The material which had a Brookfield viscosity of 9.5 centipoises was coated on a flexible polyethylene terephthalate transparent film having a thickness of .0075 inch which contained a substratum of a copolymer comprising 90 parts vinylidene chloride, 10 parts methyl methacrylate, and 2 parts of itaconic acid all by weight as described in Alles, U.S. Pat. 2,627,088. The coating was dried and to the surface of the photopolymerizable layer there was laminated a 0.001 inch thick uncoated polyethylene terephthalate film at a pressure of 58 pounds per square inch and a temperature of 95±5° C. The resulting element was exposed through a 20 $\sqrt{2}$ sensitometric step wedge with a high-intensity incandescent filament lamp that gives off linear radiation starting at 3,000 A through the visible spectrum (Sylvania SQ–60 Sun Gun) for 15 seconds at a distance of 36 inches. The .001 inch film was stripped off, leaving the photopolymer layer on the subbed film support. The unexposed portion of the layer was then thermally transferred by pressing the layer in contact with a paper support at a temperature of about 100° C. This left a high contrast image of 6 $\sqrt{2}$ steps on the film support. A control coating of all of the above ingredients except the tributyl tin acetate was also made and exposed as described above. The addition of the tin compound gave improved speed both to actinic radiation and to radiation of $\lambda_{max.}$ 650. The image for the control showed only 2 $\sqrt{2}$ steps. The tin compound increased shelf-life stability under ambient conditions to more than three months as compared to two weeks for the control. It also gave better color dispersion and better transfer characteristics as compared to the control which showed considerable stain and lesser sensitivity in the $\lambda_{max.}$ 650 area of the spectrum.

Example II.—A photopolymerizable composition was prepared as follows:

| | Grams |
|---|---|
| Copolymer of methyl methacrylate/methacrylic acid (in mol percent of 90/10) | 45.0 |
| Pentaerythritol triacrylate | 50.0 |
| Safranin Bluish (C.I. 50205) | 0.5 |
| 5,5-dimethyl-1,3-cyclohexadione | 1.7 |
| Polyoxyethylene (4) lauryl ether | 7.5 |
| Tributyl tin acetate | 2.0 |
| Carbon black (particle size 13 millimicrons) (15% isopropanol) | 10.0 |
| Trichloroethylene to make | 650.0 |

The mixture was milled, coated, exposed and transferred as described in Example I and the results were compared with a control which did not contain the tin compound. The layer containing the tin compound gave a polymerzied image of 5 $\sqrt{2}$ steps as compared to the control which gave 3 $\sqrt{2}$ steps. The coating also showed the other improved characteristics set forth in Example I when compared to the control.

Example III.—A coating composition was formulated as follows:

| | Grams |
|---|---|
| Copolymer of methyl methacrylate/methacrylic acid (90/10) | 40.0 |
| Triethylene glycol dimethacrylate | 51.0 |
| Methylene Blue (C.I. 52015) | 1.5 |
| 5,5-dimethyl-1,3-cyclohexadione | 1.7 |
| Tributyl tin acetate | 2.0 |
| Carbon black (particle size 13 millimicrons) (15% in isopropanol) | 10.0 |
| Polyoxyethylene (4) lauryl ether | 10.0 |
| Trichloroethylene to make | 650.0 |

The mixture was ball-milled for 16 hours and was thoroughly mixed. It had a Brookfield viscosity of 7.5 centipoises. The composition was coated, dried and laminated as described in Example I. After exposure and transfer, a 9 $\sqrt{2}$ step image was obtained on the film support as compared to 2 $\sqrt{2}$ step image for the control containing no tin compound.

Example IV.—The following coating composition was formulated.

| | Grams |
|---|---|
| Copolymer of polymethyl methacrylate/methacrylic acid (90/10) | 40.0 |
| Tetraethylene glycol dimethacrylate | 46.0 |
| New Methylene Blue (C.I. 52030) | 1.5 |
| 5,5-dimethyl-1,3-cyclohexadione | 1.7 |
| Tributyl tin acetate | 2.0 |
| Carbon black (particle size 13 millimicrons) (15% in isopropanol) | 10.0 |
| Polyoxyethylene (4) lauryl ether | 10.0 |
| Trichloroethylene to make | 650.0 |

The mixture was ball-milled for 16 hours. The Brookfield viscosity was 7.5 centipoises. Upon coating, exposing and treating as in Example I an image of 9 $\sqrt{2}$ steps was obtained on the film support.

Example V.—A coating composition was formulated as follows:

| | Grams |
|---|---|
| Copolymer of methyl methacrylate/methacrylic acid (90/10) | 40.0 |
| Triacrylate of reaction product of trimethylol propane and ethylene oxide (M.W. 1000) | 45.0 |
| Polyoxyethylene (4) lauryl ether | 10.0 |
| Carbon black (particle size 13 millimicrons) (15% in isopropanol) | 10.0 |
| New Methylene Blue (C.I. 52030) | 1.5 |
| 5,5-dimethyl-1,3-cyclohexadione | 5.0 |
| Triphenyl tin chloride | 2.0 |
| Trichloroethylene to make | 650.0 |

The mixture was ball-milled for 16 hours and then coated, laminated, exposed and transferred to give an image remaining on the film support showing 6 $\sqrt{2}$ steps as against only 2 $\sqrt{2}$ for a control.

The incorporation of triphenyl tin acetate and triphenyl tin hydroxide in the above formulation gave images of 5 $\sqrt{2}$ steps.

Example VI.—A photopolymerizable coating composition formulated as follows:

| | Grams |
|---|---|
| Polymethyl methacrylate (inherent viscosity: 0.20–0.22 for a solution of 0.25 in 50 mls. chloroform, at 20° C., using a No. 50 Cannon-Fenske Viscosimeter) | 40.0 |
| Triacrylate monomer of Example V | 45.0 |
| Carbon black (particle size 13 millimicrons) (15% in isopropanol) | 5.0 |

| | Grams |
|---|---|
| Methylene Blue | 2.0 |
| 5,5-dimethyl-1,3-cyclohexadione | 2.0 |
| Tributyl tin acetate | 2.0 |
| Trichloroethylene to make | 850.0 |

The mixture was ball-milled for 16 hours and coated and laminated, exposed for 45 seconds and transferred as in Example I. The resulting image on the film support showed 5 $\sqrt{2}$ steps as compared to 3 $\sqrt{2}$ for a control.

Example VII.—A coating composition was made having the following formulation:

| | Grams |
|---|---|
| Polymethyl methacrylate of Example VI (added as a 25% solution in trichloroethylene) | 180.0 |
| Pentaerythritol triacrylate | 5.0 |
| 3,3′ - diethyl - 5′-phenyl-9-methyl-2,2′-thiaoxycarbocyanine iodide | 0.05 |
| Triphenyl tin acetate | 0.5 |
| Carbon tetrabromide | 0.5 |
| Acetone | 26.0 |

The composition was mixed thoroughly and coated and laminated as described in Example I. The resulting element was exposed for 30 seconds through a $\sqrt{2}$ step wedge to a Sylvania SQ–60 Sun Gun, the laminate removed and the unexposed portion of the layer transferred to a paper support at 100° C. A control without the tin compound gave an image of 3 $\sqrt{2}$steps. The composition containing the tin compound gave an image of 8 $\sqrt{2}$ steps.

Example VIII.—A coating composition was formulated as follows:

| | Grams |
|---|---|
| Polymethyl methacrylate solution (Example VII) | 100.0 |
| Pentaerythritol triacrylate | 5.0 |
| Cyanine dye of Example VII | 0.05 |
| Triphenyl tin acetate | 0.5 |
| 5,5-dimethyl-1,5-cyclohexadione | 0.4 |
| Acetone | 26.0 |

The composition was coated, laminated, exposed and transferred as in Example VII to give an image showing 5 $\sqrt{2}$ steps. A control showed no image at all. Substituting tributyl tin acetate in the above formula improved the speed and gave an image showing 7 $\sqrt{2}$ steps.

Example IX.—Twelve coating compositions were formulated as follows:

| | Grams |
|---|---|
| Copolymer of Example I (10% solution in trichloroethylene) | 55.0 |
| Pentoerythritol triacrylate | 5.0 |
| Polyoxyethylene (4) lauryl ether | 1.0 |
| 5,5-dimethyl-1,3-cyclohexadione | .10 |
| New Methylene Blue (C.I. 52030) | .05 |

The above compositions were mixed thoroughly and into each composition there was incorporated one tenth of a gram of one of the organometallic compounds set forth below. The compositions were coated, laminated and exposed for 15 seconds as described above and then delaminated and the unexposed portion of the layer transferred. The results. are shown as follows:

| Organometallic Compounds: | Speed $\sqrt{2}$ steps visible |
|---|---|
| (1) None (control) | 2 |
| (2) $(C_2H_5)_3PbCl$ | 6 |
| (3) $(Phenyl)_4Sn$ | 6 |
| (4) $(C_4H_9)_2SnO$ | 6 |
| (5) $(C_4H_9)_3Sn$ resinate | 7 |
| (6) $C_4H_9SnBr_3$ | 3 |
| (7) $(C_4H_9)_4Sn$ | 7 |
| (8) $(C_3H_7)_3SnBr$ | 3 |
| (9) $(C_2H_5)_4Pb$ | 6 |
| (10) $(C_6H_5)_3PbCl$ | 5 |

| Organometallic Compounds: | Speed $\sqrt{2}$ steps visible |
|---|---|
| (11) $(C_6H_5)_4Pb$ | 5 |
| (12) $(C_4H_9)_4Ge$ | 4 |

Example X.—A stock solution was formulated as follows:

| | | |
|---|---|---|
| Copolymer of Example I (added as a 10% solution in trichloroethylene) | grams | 150.0 |
| Triacrylate of trimethylol propane | grams | 21.0 |
| Polyoxyethylene (4) lauryl ether | grams | 3.0 |
| 5,5-dimethyl-1,3-cyclohexadione | grams | .3 |
| Methylene Blue (C.I. 52015) | grams | .05 |
| Isopropyl alcohol | ml | 5.0 |

(A) The above solution was milled, coated, exposed and delaminated as in Example I to be used as a control.

(B) To 25 grams of the above stock solution there was added .05 gram of a mixture of tetraisopropyl titanium and tetrastearyl titanium.

The composition was milled, coated, exposed and delaminated as in Example I.

(C) To 25 grams of the above stock solution there was added .05 gram of triphenyl lead chloride. The resulting composition was milled, coated, exposed and delaminated as in Example I.

After delamination each of the coatings was dusted with a black pigment (Jungle Black C.I. 50410) and the unexposed pigmented portions of the layer were transferred to paper to give a high contrast image. In the case of A which contained no organometallic compound all of the $\sqrt{2}$ steps transferred to the paper. The B composition containing the titanium mixture transferred 17 $\sqrt{2}$ steps leaving 3 $\sqrt{2}$ steps on the original support. The C portion containing triphenyl lead chloride showed 6 $\sqrt{2}$ steps on the support.

Example XI.—This example demonstrates the beneficial results obtained by adding an organometallic compound to a photopolymerization system used in the preparation of a lithographic printing plate. The following composition was prepared.

| | Grams |
|---|---|
| Copolymer of Example I | 18.0 |
| Pontacyl Wool Blue (Acid Blue C.I. 102) | .3 |
| 2-(p-dimethylaminostyryl) - 3 - nondecyl-4-methyl-4 - hydroxy - methyl oxazoline bromide | .3 |
| 9,10-phenanthrenequinone | .3 |
| Triethylene glycol diacetate | 4.0 |
| Pentaerythritol triacrylate | 12.0 |
| Tributyl tin chloride | .3 |
| 2-ethoxyethanol | 200.0 |

The above composition was milled and coated on a brushed aluminum plate and dried to give a dry coating weight of 41 mg./dm.$^2$. The plate was overcoated with a 3% aqueous solution of polyvinyl alcohol (medium viscosity 99% saponified) to give a coating weight of 5 mg./dm.$^2$. The plate was exposed to a 20 step $\sqrt{2}$ step wedge for 60 units using a Luxometer light integrator Model H to control the NuArc Model FT26L Xenon exposure device. A control plate coated with the above composition minus the organo tin compound was also exposed as above. The plates were developed in the following solution.

Trisodium phosphate ($Na_3PO_4 \cdot 12H_2O$) __grams__ 25.0
Sodium hexametaphosphate __grams__ 12.0
Sodium phosphate (monobasic) __grams__ 4.4
Tirton®X–100

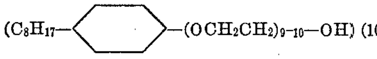

(10% aqueous) ml. 2.0

2-butoxyethanol __ml__ 45.0
Water to make (pH adjusted to 11.0) 1 liter.

The plate was immersed in the developer and allowed to soak for 30 seconds. The entire polyvinyl alcohol layer and unexposed areas of the photopolymerizable layer were removed by rubbing. The control showed an image of 4 $\sqrt{2}$ steps on the plate while the plates with the layer containing the organotin compound showed an image of 6 $\sqrt{2}$ steps. Similar coatings containing triphenyl tin acetate and triphenyl tin chloride gave images of 7 $\sqrt{2}$ steps and 6 $\sqrt{2}$ steps respectively.

In addition to the polyethylene terephthalate films used as supports for coating the above composition there may be used several types of substantially transparent films. Films composed of high polymers, e.g., polyamides, polyolefins, polyesters, vinyl polymers and cellulose esters are quite suitable and the films may or may not contain an auxiliary layer to control anchorage or act as an antihalation layer. Specific high polymer films from each of the classes include: polyamides, i.e., polyhexamethylene sebacamide, polyhexamethylene adipamide; polyethylene terephthalate/isophthalic copolymers of British Patent 766,290; vinyl acetals, vinylidene chloride copolymerized with vinyl chloride, styrene and acrylonitrile, cellulose acetate, cellulose acetate/butyrate, viscose rayon, etc.

Films and sheets suitable for laminating may be any of the above films and the surfaces may be modified to cause separation of the unexposed and exposed images. In this case it is unnecessary to thermally transfer as shown in Examples I–IX. Such modified supports may be the drafting films described and claimed in Van Stappen, U.S. Patent 2,964,423 and Centa et al. U.S. Patent 3,115,420.

In addition to the macromolecular organic binders mentioned in the examples, others include those listed in 3,060,023.

In addition to the ethylenically saturated monomers set forth in the examples, various other free-radical initiated, chain-propagating, addition polymerizable, ethylenically unsaturated compounds having a molecular weight of at least 300 and which can be used with the above polymers include those having a plurality of addition polymerizable ethylenic linkages, particularly when present as terminal linkages, and especially those wherein at least one and preferably most of such linkages are conjugated with a double bonded carbon, including carbon doubly bonded to carbon and to such heteroatoms as nitrogen, oxygen and sulfur. Outstanding are such materials wherein the ethylenically unsaturated groups, especially vinylidene groups are conjugated with ester of amide structures. Suitable compounds are those disclosed in Plambeck, U.S. Patent 3,791,504 and those disclosed in Celeste & Bauer, U.S. Patent 3,261,686 and Cohen & Schoenthaler, U.S. Ser. No. 370,338 filed May 26, 1964, now Patent No. 3,380,831.

A suitable class of free-radical generating addition polymerization initiators activatable by actinic light and thermally inactive below 185° C. includes the substituted and unsubstituted polynuclear quinones which are compounds having two intracyclic carbonyl groups attached to intracyclic carbon atoms in a conjugated carbocyclic ring system. Suitable such initiators are listed in Notley 2,951,758, Sept. 6, 1960 and Burg et al. 3,060,023.

In place of the photoreducible dyes of the Examples, there can be used other such dyes including: Azure A (C.I. 52005), Azure B (C.I. 52010), Toluidine Blue O (C.I. 52040), Capri Blue (C.I. 51015), Brilliant Cresol Blue (C.I. 51010), Safranine Bluish (C.I. 50205), Neutral Red (C.I. 50040), and Fuchsin (C.I. 42510).

In addition to carbon black and other coloring matters disclosed in the above examples, other pigments and dyes listed in the patents referred to above may be used.

The compositions and elements of this invention are useful for many purposes. For example, they may be used to make lithographic offset printing elements because the solid images obtained are substantially resistant to chemical or solvent attack.

The advantages of this invention are many. It provides higher speed photopolymer systems. It provides photopolymerizable elements having longer shelf life due to increased stability.

The embodiments of the invention in which an exclusive property or privilege is claimed are defined as follows:

1. A photopolymerizable composition comprising:

(1) 40 to 90 parts by weight of a compatible, coherent film-forming macromolecular organic polymer having a molecular weight greater than 10,000.

(2) 10 to 60 parts by weight of a normally non-gaseous, ethylenically unsaturated compound containing 1 to 4 terminal ethylenic groups having a molecular weight of at least 200, a boiling point above 100° C. at normal atmospheric pressure and being capable of forming a high polymer by photoinitiated addition polymerization, and (3) 0.001 to 20 parts by weight of an addition polymerization initiator activatable by actinic light and inactive thermally below 85° C. and preferably below 185° C.;

characterized by the presence of (4) .01 to 10 parts by weight of at least one covalent organometal compound of tin, lead, germanium, or titanium having at least one carbon to metal bond.

2. A composition according to claim 1, wherein said organic polymer is a methyl methacrylate/methacrylic acid copolymer.

3. A composition according to claim 1, wherein said unsaturated compound is a triacrylate of a polyhydric alcohol of 2–8 carbon atoms.

4. A composition according to claim 1, wherein said unsaturated compound is trimethylene glycol dimethacrylate.

5. A composition according to claim 1, wherein said unsaturated compound is pentaerythritol triacrylate.

6. A composition according to claim 1, wherein said organometal compound is tributyl tin acetate.

7. A composition according to claim 1, wherein said organometal compound is triphenyl tin chloride.

8. A photopolymerizable solid layer comprising:

(1) 40 to 90 parts by weight of a compatible, coherent film-forming macromolecular organic polymer having a molecular weight greater than 10,000, (2) 10 to 60 parts by weight of a normally non-gaseous, ethylenically unsaturated compound containing 1 to 4 terminal ethylenic groups having a molecular weight of at least 200, a boiling point above 100° C. at normal atmospheric pressure and being capable of forming a high polymer by photoinitiated addition polymerization, and (3) 0.001 to 20 parts by weight of an addition polymerization initiator activatable by actinic light and inactive thermally below 85° C. and preferably below 185° C.;

characterized by the presence of (4) .01 to 10 parts by weight of at least one covalent organometal compound of tin, lead, germanium, or titanium having at least one carbon-to-metal bond.

9. A layer according to claim 8, wherein said organic polymer is a methyl methacrylate/methacrylic acid copolymer.

10. A layer according to claim 8, wherein said unsaturated compound is a triacrylate of a polyhydric alcohol of 2–8 carbon atoms.

11. A layer according to claim 8, wherein said unsaturated compound is trimethylene glycol dimethacrylate.

12. A layer according to claim 8, wherein said unsaturated compound is pentaerythritol triacrylate.

13. A layer according to claim 1, wherein said organometal compound is tributyl tin acetate.

14. A layer according to claim 1, wherein said organometal compound is triphenyl tin chloride.

(References on following page)

References Cited

UNITED STATES PATENTS

| | | | |
|---|---|---|---|
| 2,206,022 | 7/1940 | Britton et al. | 260—80 |
| 2,600,683 | 6/1952 | Pearson | 260—87.1 |
| 2,725,369 | 11/1955 | Robinson | 260—80.5 |
| 2,880,152 | 3/1959 | Hiltz et al. | 204—158 |

RONALD H. SMITH, Primary Examiner

U.S. Cl. X.R.

96—35.1; 204—159.24

PO-1050
(5/69)

UNITED STATES PATENT OFFICE
CERTIFICATE OF CORRECTION

Patent No. 3,547,651 Dated Dec. 15, 1970

Inventor(s) Leo Roos

It is certified that error appears in the above-identified patent and that said Letters Patent are hereby corrected as shown below:

Col. 5, line 52, "Pentoerythritol" should be --Pentaerythritc

Claim 3, lines 2 and 3, "polyhydric alcohol of 2-8 carbon atoms" should read --trimethylolpropane/ethylene oxide reactic product--.

Claim 4, line 2, "trimethylene" should read --triethylene--.

Claim 10, lines 2 and 3, "polyhydric alcohol of 2-8 carbon atoms" should read --trimethylolpropane/ethylene oxide reacti product--.

Claim 11, line 2, "trimethylene" should read --triethylene--.

Signed and sealed this 20th day of April 1971.

(SEAL)
Attest:

EDWARD M.FLETCHER,JR.
Attesting Officer

WILLIAM E. SCHUYLER, JR.
Commissioner of Patents